United States Patent [19]

Day

[11] Patent Number: 4,827,372
[45] Date of Patent: May 2, 1989

[54] MOUNTING ASSEMBLY

[75] Inventor: James L. Day, Victor, N.Y.

[73] Assignee: James L. Day Co., Inc., Victor, N.Y.

[21] Appl. No.: 205,256

[22] Filed: Jun. 10, 1988

[51] Int. Cl.[4] .............................................. H02B 1/08
[52] U.S. Cl. ..................... 361/331; 174/97;
 174/101; 361/395; 361/417; 361/428
[58] Field of Search ............... 174/97, 101; 361/331,
 361/380, 395, 399, 428, 417, 419–420

[56] References Cited

U.S. PATENT DOCUMENTS

| 3,821,688 | 6/1974 | Larsile | 174/97 |
| 4,249,229 | 2/1981 | Hester | 361/400 |
| 4,744,010 | 5/1988 | Witte | 174/97 |

Primary Examiner—A. D. Pellinen
Assistant Examiner—Gregory D. Thompson
Attorney, Agent, or Firm—Martin Lukacher

[57] ABSTRACT

An assembly for mounting and connecting components, either electrical or pneumatic devices, which are arranged on boards such as printed circuit boards. A channel having a base and flexible side walls receives the edges of the boards in grooves along the side wall. Flexible sidewalls spread apart to receive the boards and lock them in the grooves. Several boards may be located in a channel in end to end relationship. Conduits are defined between the insides of the side walls, the base and the side of the boards facing the base. The components on the boards are located on the outside. Wiring and tubing lines extend through the openings in the boards into the conduits and extend along the conduits. End plates at the opposite ends of the conduits may be used to close the ends of the conduits except for openings through which the wiring and tubing extends. Several channels can be mounted side-by-side with spacing therebetween only sufficient to allow flexing of the sidewalls for the insertion and removal of the boards, on a panel by attaching the bases of the channels to the panel. The assembly thereby presents a clean appearance (the lines being in the conduits) with easy access to the components on the board for repair and maintenance.

17 Claims, 4 Drawing Sheets

MOUNTING ASSEMBLY

DESCRIPTION

The present invention relates to mounting assemblies or systems for mounting boards which carry components such as electrical or pneumatic devices including relays, integrated circuits, transistors, pneumatic valves and pneumatic controllers in integrated assembly and particularly to a system wherein the boards can be arranged compactly with efficient utilization of space so as to provide control panels for control systems which control electrical and pneumatic processes as in heating, ventilating and air conditioning systems and control systems for other industrial and commercial applications.

It is the principal object of this invention to provide an improved mounting assembly or mounting system in which the lines (wiring and tubing) interconnecting the components of a control system are not exposed, but which leave the components exposed and accessible for repair and maintenance.

Another ancillary feature of the invention is to isolate the boards on which the components are mounted electrically and physically from mounting panels, which may be at electrical ground potential, thereby providing for ventilation and electrical and fire safety.

A still further feature of the invention is to enable the boards to be mounted side-by-side and end-to-end in a compact arrangement which may be altered to meet system requirements and yet maintain high packing density and efficient space utilization in a control panel containing the boards.

Heretofore, various enclosures for printed circuit boards have been suggested which mounts the boards in stacks; the boards being inserted in slots or racks in the walls of the enclosures. See Arquin et al., U.S. Pat. No. 3,258,649, June 28, 1986; Brown et al., U.S. Pat. No. 3,302,350 issued Feb. 7, 1967 and Flenige, U.S. Pat. No. 3,850,301, Nov. 26, 1974. Also plastic channels have been used as sockets for receiving printed circuit boards. Such enclosures and sockets nevertheless require exposed wiring for interconnecting the components on the boards, which wiring can conceal the components and make access thereto for maintenance, difficult. Also, protection of the boards from grounded surfaces and space for ventilation has also not been provided.

It is therefore the principal object of the present invention to provide improved mounting assemblies and a mounting system for boards in which the foregoing features are obtained and the disadvantages of heretofore available systems eliminated.

Briefly described, an assembly for mounting and connecting components on boards in accordance with the invention utilizes a channel having a base and free standing side walls of flexible material on the base. The walls are biased to resist spreading apart. The walls have grooves which are opposed to each other and are spaced closer to the top or rims of the channel than to the base. The boards are removable received in the grooves and define with the side walls and base, internally of the channels, conduits for lines (wiring and tubing) which connect to the components. The components are mounted on the outside of the board. The boards have openings through which the lines extend as from connector and terminal block components which are also mounted on the outsides of the boards. The lines extend along the conduits and exit from the assembly through the ends thereof which are connected to metering devices and/or to the systems which are controlled by the components on the board. A plurality of boards may be arranged in end-to-end relationship in the channel and a multiplicity of channels may be mounted side-by-side on a backing panel to which the bases of the channels are attached. The spacing between the channels is sufficient only to allow for flexure of the side walls for insertion and removal of the boards. A cover channel may be attached to the outside of the channel side walls by snapover attachment means such as grooves and ridges. End plates may be used to enclose both the covers and the ends of the channels. The arrangement of boards in channels and the arrangement of channels is entirely flexible and may be varied to meet system requirements. The spacing of the boards from the backing panel and the conduits serve dual purposes of fire safety and ventilation while forming the conduits so that all wiring and plumbing is contained in the conduits and not exposed to detract from the appearance of the panel or to interfere with maintenance operations.

The foregoing and other objects, features and advantages of the invention as well as a presently preferred embodiment thereof will become more apparent from a reading of the following description in connection with the accompanying drawings in which.

Figure 1:
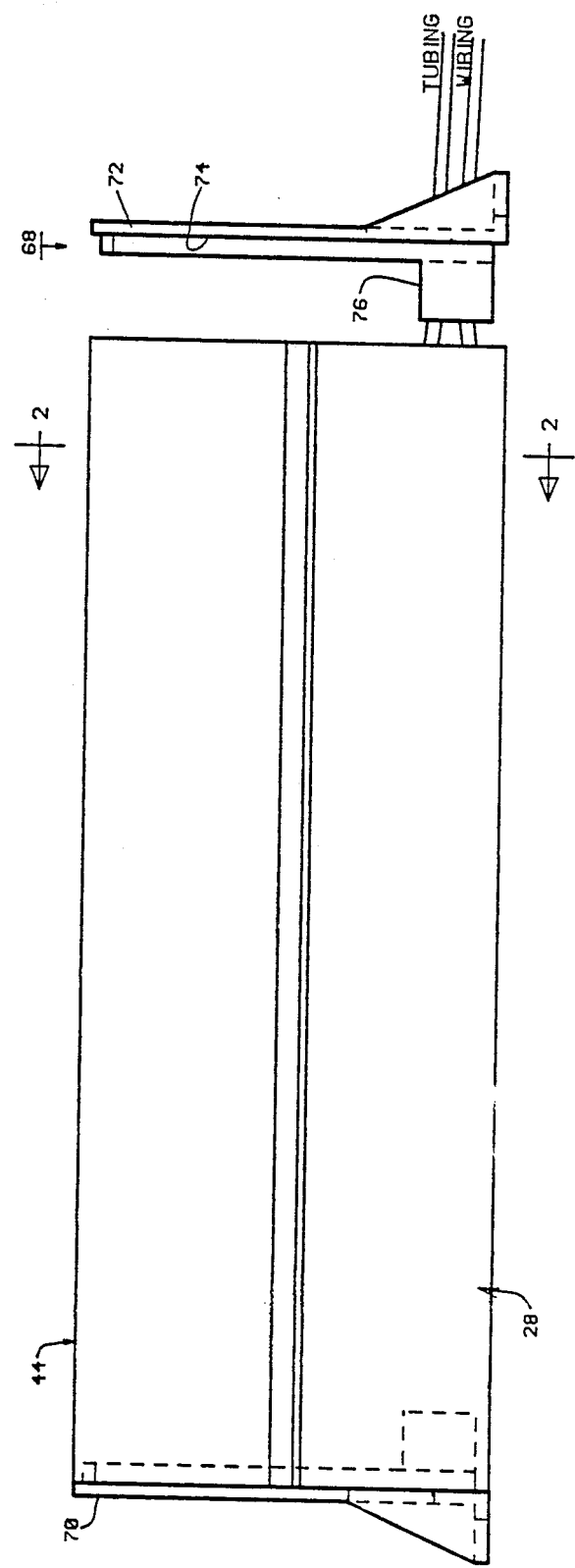
FIG. 1 is a view, in elevation, of a mounting assembly in accordance with the invention, one end plate being shown separated from the assembly.
Figure 2:
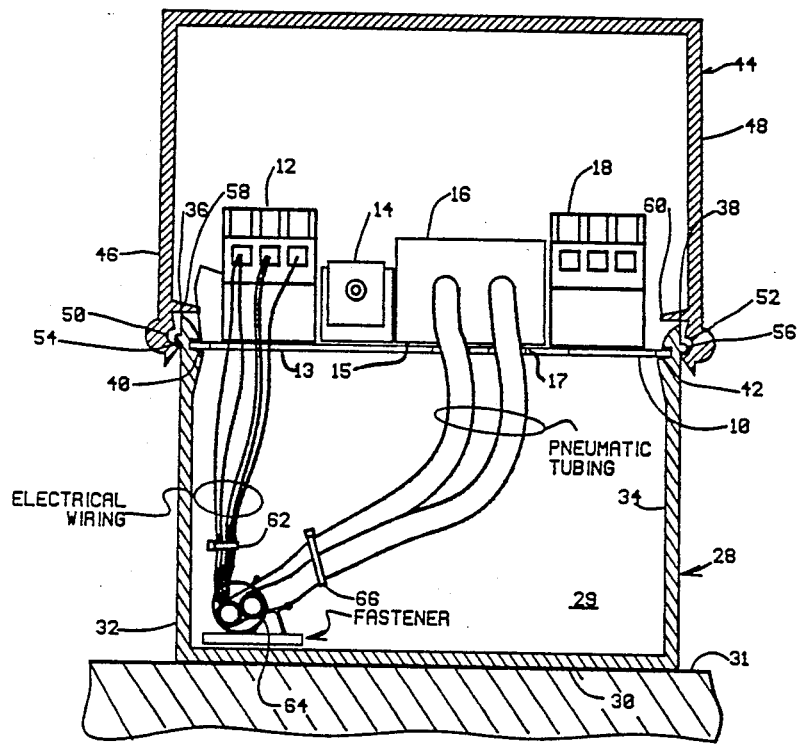
FIG. 2 is a sectional view of the assembly shown in FIG. 1 taken along the line 2—2 in FIG. 1.

Referring to FIGS. 1 and 2 of the drawings, there is a shown a printed circuit board 10 having components 12, 14, 16, and 18 mounted on the top surface thereof. Components 14 and 16 may be electrical or pneumatic components. Component 12 is a terminal block or connector from which wiring extends. Component 16 may be a coupling device from which pneumatic tubing extends (pneumatic couplings). The board 10 has openings 13, 15 and 17 therethrough adjacent the components 12 and 16. The openings may be along the edges of the board and are provided by slots therein as shown at 20, 22, 24 and 26 in FIG. 3 as well as other openings at the ends of the boards or along edges thereof.

A channel 28 having a base 30 and side walls 32 and 34 receives the board 10. The channel 28 may be made of flexible material or at least the side walls 32 and 34 are flexibly mounted on the base 30. A suitable material is plastic, such as PVC or polycarbonate plastic. The side walls 32 and 34 are free standing and have top surfaces or edges 36 and 38. Adjacent to the top edges, and much closer to the top edges 36 and 38 than to the base 30, are grooves 40 and 42. The tops of the side walls may be enlarged or somewhat bulbos in the portions where the grooves are received. Also these top portions are tapered so as to enable the boards to spread the side walls apart against their natural bias, which tends to bring them together, to provide the rectangular cross-section shown in FIG. 2. The edges of the boards snap into the grooves and are locked therein.

Locking is facilitated by a cover channel 44 also of flexible material, and preferably of clear material so that the components are visible. The cover channel 44 also has side walls 46 and 48 with free edges adjacent to which are grooves 50 and 52 which receive ridges 54 and 56 on the outsides of the side walls 32 and 34 of the channel 28. Alternatively the channel 28 may be provided with grooves and the cover channel 44 with ridges. The arrangement shown in the drawings is however presently preferred. There are further ridges 58 and 60 extending inwardly from the insides of the side walls 46 and 48 spaced above the free ends of the walls 46 and 48. These ridges 58 and 60 serve as stops and assure that there is sufficient space, for ventilation above the components 12, 14, 16 and 18 and the other components on the boards 10.

The board 10, the side walls 32 and 38 and base 30 define a longitudinal conduit 29 in which the lines (electrical wiring and pneumatic tubing) extend. These lines may be held together in a harness by rings 62, 64 and 66, the rings being connected to fasteners, which may be attached by means not shown, to the base 30. The wiring extends the length of the conduit 29 and through at least one of two end plates 68 and 70 which close the opposite ends of the channels 28 and covers 44. Snap in grooves or indentations may be provided at the ends of the channels or covers for removably attaching the end plates 68 and 70. The tubing and wiring extends through openings in the end plates or at least through one of the end plates 68 as shown in FIG. 1. The end plates have flanges 72 which define inside steps 74 which extend into the open ends of the channels and cover. A guiding projection 76 or grommet may be provided for leading the tubing and wiring through the end plate 68.

The conduit 29 contains all of the exposed wiring and tubing, leaving the top side of the board free and uncluttered. The spacing between the board and the base provides a conduit of sufficient size for ventilation purposes and also provides spacing between the boards and the base which may be connected to a support panel 31 on which a multiplicity of assemblies of channels and boards may be mounted. This panel 31 may be at ground potential. Therefore, shorts are avoided and fire safety is enhanced.

Figure 3:
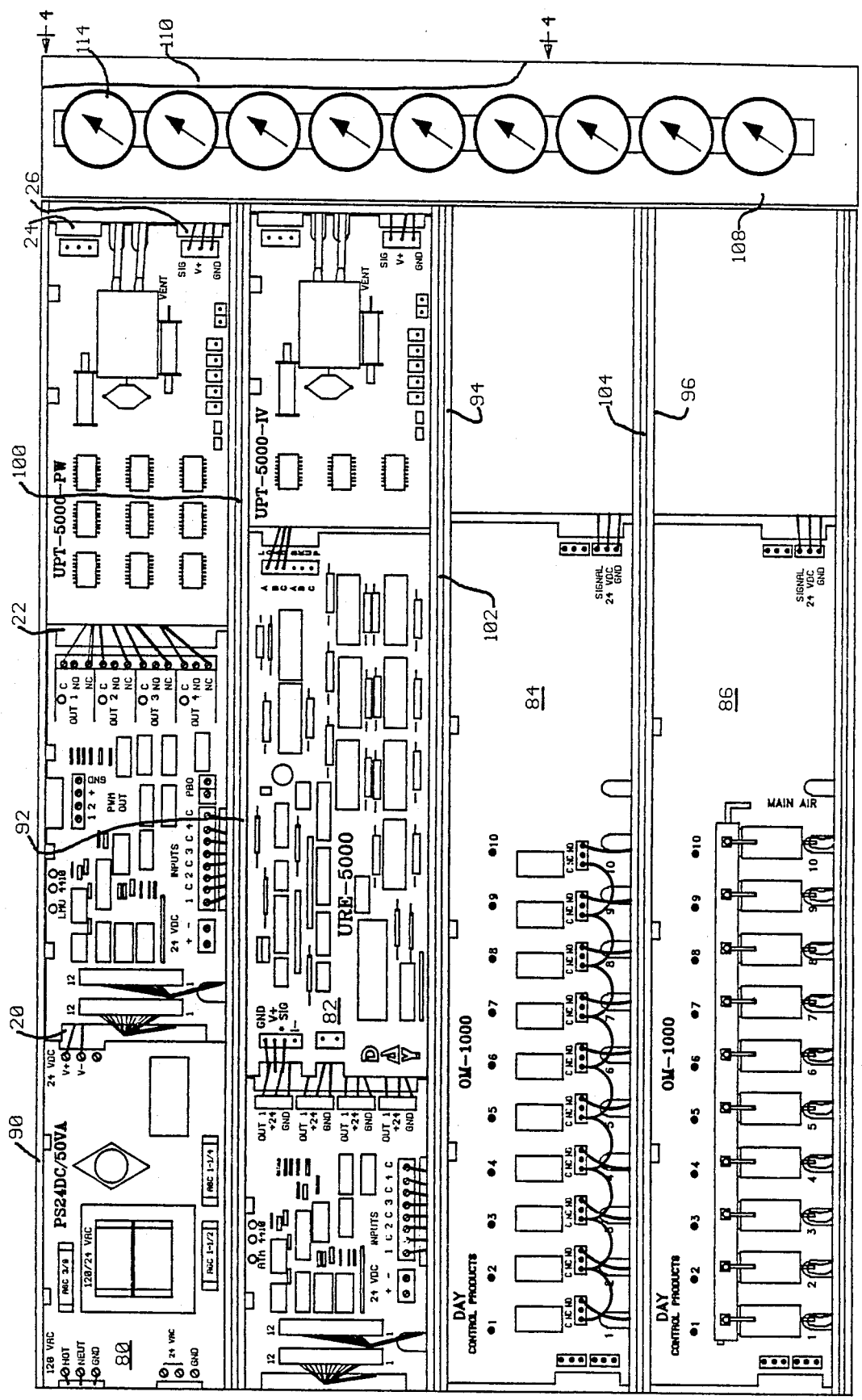
FIG. 3 is a elevational view of a panel containing a plurality of board/channel assemblies with the covers removed.

As shown in FIG. 3 there are four assemblies, 80, 82, 84 and 86. Each has a separate channel 90, 92, 94 and 96. Different compliments of boards are mounted in each of the channels 90, 92, 94 and 96. All wiring and tubing extends through openings in the edges of the boards into conduits defined between the boards and the side walls and base of each of the channels. There is no exposed wiring or tubing, except from the connectors or terminal blocks which are mounted on the top sides of the boards. The boards are designated by product numbers in FIG. 3. Their boards are used in control systems for heating, ventilating, and air conditioning and are available from the James L. Day Company, Inc. of Victor, N.Y., U.S.A.

The channels 90, 92, 94 and 96 are closely spaced in side-by-side relationship with spacing shown at 100, 102 and 104 between the boards being sufficient only to allow for flexure of the side walls for insertion and removal of the boards. This spacing is occupied by the covers when covers are used. The use of covers is optional.

Figure 4:
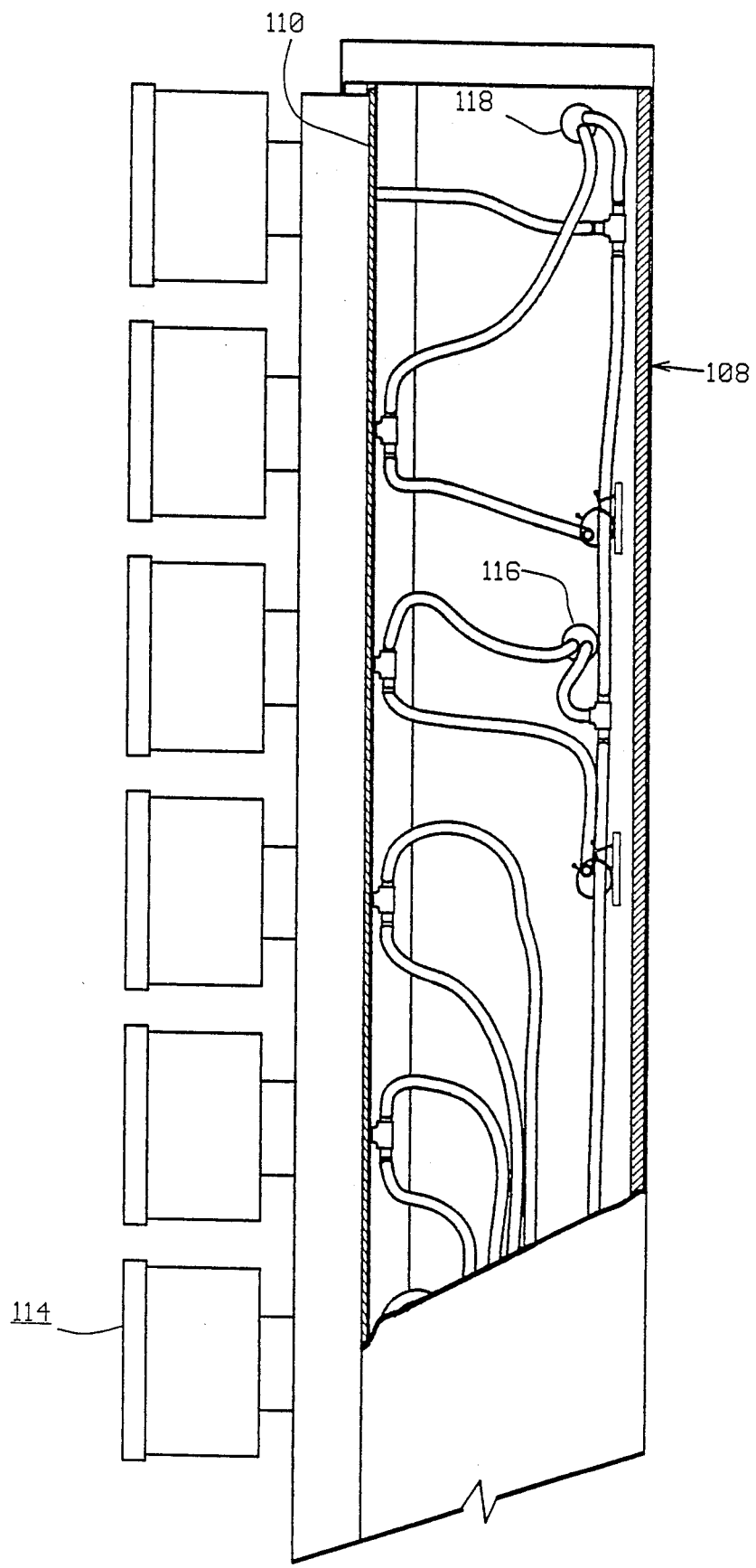
FIG. 4 is a fragmentary, sectional end view of the panel shown in FIG. 3 taken along 4—4 in FIG. 3.

As shown in FIG. 4, side of the channel and board assemblies 90, 92, 94 and 96 and adjacent the right ends thereof, which ends are in alignment as are the left ends, is a channel 108 containing a board 110 on which an array of meters (pressure gauges) 114 is mounted. The pneumatic tubing from the conduits of the assemblies 90, 92, 94 and 96 extends through openings 116 and 118 into the conduits of the channel and board assemblies 90-96. The tubing is connected through openings in the board 110 to the gauges 114. Accordingly, a very compact panel arrangement is provided by using the mounting assemblies and system provided in accordance with the invention.

From the foregoing description it will be apparent that there has been provided an improved mounting system and mounting assemblies for circuit boards and the like. While a preferred embodiment of the system has been illustrated, variations and modifications thereof within the scope of the invention will undoubtedly suggest themselves to those skilled in the art. Accordingly, the foregoing description should be taken as illustrative and not in a limiting sense.

I claim:

1. An assembly for mounting and connecting components which comprises a channel having a base and free standing sidewalls of flexible material on said base which are biased to resist spreading apart of said sidewalls, the ends of such sidewalls above said base defining the top of said channel, grooves along said sidewalls being opposed to each other and spaced closer to the top of said channel than to said base, at least one rigid printed circuit board with opposite sides and having edges removably received in said grooves, said components being mounted on one of the opposite sides of said board, one or more openings in said board extending through said board from said one to the other of said opposite sides thereof, lines connected to said components extending from said components through said one or more openings, the distance between said board and said base and the distance between said sidewalls being at least in a ratio of about 1:1 to define a conduit containing said lines and providing an enclosed passage for said lines within and along said channel.

2. The assembly according to claim 1 wherein a plurality of said boards are disposed along said channel in said grooves in end-to-end relationship, a slot along an end of at least one of said boards providing at least one of said one or more openings.

3. An assembly for mounting and connecting components which comprises a channel having a base and free standing sidewalls of flexible material on said base which are biased to resist spreading apart of said sidewalls, the ends of said sidewalls above said base defining the top of said channel, grooves along said sidewalls being opposed to each other and spaced closer to the top of said channel than to said base, at least one rigid board with opposite sides and having edges removably received in said grooves, said components being mounted on one of the opposite sides of said board, one or more openings in said board extending through said board from said one to the other of said opposite sides thereof, lines connected to said components extending from said components through said one or more openings, the distance between said board and said base and the distance between said sidewalls being sufficient to define a conduit containing said lines and providing an enclosed passage for said lines within and along said channel, said components being selected from the group consisting of electrical and pneumatic devices, said lines being wires and flexible tubing which extend through said one or more openings and run along said conduit in said channel to at least one of the opposite ends of said channel.

4. The assembly according to claim 3 wherein said components include other devices selected from the group consisting of connectors, terminal blocks and pneumatic couplings, said other devices being disposed on said one of said opposite sides of said board adjacent said one or more openings therein and tubing and wiring extending from said other devices through said one or more openings into said conduit.

5. The assembly according to claim 4 wherein except for said wiring which extends through said one or more openings and printed wiring on said board there is no other wiring which is exposed on said one of said opposite sides of said board.

6. The assembly according to claim 4 wherein except for said tubing which extends through said one or more openings there is no tubing which is exposed on said one of said opposite sides of said board.

7. The assembly according to claim 1 further comprising a panel, said channel being a first channel which is mounted on said panel with said base connected to said panel, at least one additional assembly as defined in claim 1, said additional assembly including a second channel disposed in side-by-side relationship with said first channel.

8. The assembly according to claim 7 wherein spacing is provided between said first and second channels just sufficient to enable flexing of said sidewalls for insertion and removal of said boards from said grooves.

9. The assembly according to claim 8 wherein a multiplicity of assemblies as defined in claim 1 are mounted with their bases on said panel and their sidewalls in side-by-side relationship with said spacing therebetween, said multiplicity including the assemblies having said first and second channels.

10. The assembly according to claim 9 wherein each of said channels are of equal length and have the ends thereof in alignment.

11. The assembly according to claim 10 further comprising another channel on said panel which extends along one of the aligned ends of said channels and is perpendicular thereto, another board mounted in said another channel and having an array of metering devices spaced from each other, and openings in one of the side walls of said another channel through which lines extend along the conduits of said multiplicity of channels to said metering devices.

12. An assembly for mounting and connecting components which comprises a channel having a base and free standing sidewalls of flexible material on said base which are biased to resist spreading apart of said sidewalls, the ends of said sidewalls above said base defining the top of said channel, grooves along said sidewalls being opposed to each other and spaced closer to the top of said channel than to said base, at least one rigid board with opposite sides and having edges removably received in said grooves, said components being mounted on one of the opposite sides of said board, one or more openings in said board extending through said board from said one to the other of said opposite sides thereof, lines connected to said components extending from said components through said one or more openings, the distance between said board and said base and the distance between said sidewalls being sufficient to define a conduit containing said lines and providing an enclosed passage for said lines within and along said channel, said channel having opposite ends each with an end face, at least one end plate disposed against one of said opposite ends, said one end plate extending into said channel and having flanges which define steps against which said end face is disposed, and said one end plate having an opening extending therethrough in alignment with said conduit, said lines extending through said opening of said one plate.

13. The assembly according to claim 12 wherein another end plate identical to said one end plate is assembled with said channel and disposed at the other of the opposite ends of said channel.

14. The assembly according to claim 12 further comprising a cover channel, means removably attaching said cover channel to said channel over said one of said opposite sides of said board to enclose said channel and said components, said cover channel having opposite ends, said one end plate also extending into said cover channel and enclosing one of said opposite ends of said channel and said cover channel.

15. The assembly according to claim 13 further comprising another end plate identical to said one end plate and assembled with said channel and said cover channel at the other of said opposite ends of said channel and cover channel.

16. The assembly according to claim 12 where said cover channel has a base and flexible sidewalls with rims extending longitudinally along said cover channel, grooves and ridges removably receivable in each other for assembling said cover channel and said channel, said cover channel having one of said grooves and ridges on the inside of the sidewalls thereof adjacent to the rims thereof while said channel has on the outside of said sidewalls thereof adjacent to the top of said sidewalls the other of said grooves and ridges.

17. The assembly according to claim 16 further comprising further ridges extending along the inside of said cover channel spaced further away from said rims than said ridges or grooves therein and providing a stop engageable with the top of said channel.

* * * * *